United States Patent
Alfieri et al.

(10) Patent No.: US 9,281,817 B2
(45) Date of Patent: Mar. 8, 2016

(54) POWER CONSERVATION USING GRAY-CODED ADDRESS SEQUENCING

(71) Applicant: NVIDIA Corporation, Santa Clara, CA (US)

(72) Inventors: Robert A. Alfieri, Chapel Hill, NC (US); Kelvin Kwok-Cheung Ng, Milpitas, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 13/731,862

(22) Filed: Dec. 31, 2012

(65) Prior Publication Data

US 2014/0184268 A1    Jul. 3, 2014

(51) Int. Cl.
*G06F 7/38*  (2006.01)
*H03K 19/173*  (2006.01)
*H03K 19/00*  (2006.01)

(52) U.S. Cl.
CPC .................................. *H03K 19/0008* (2013.01)

(58) Field of Classification Search
None
See application file for complete search history.

(56) References Cited

U.S. PATENT DOCUMENTS

| | | | |
|---|---|---|---|
| 3,421,026 A | 1/1969 | Stopper | |
| 5,835,941 A | 11/1998 | Pawlowski | |
| 6,055,590 A | 4/2000 | Pettey et al. | |
| 6,163,500 A | 12/2000 | Wilford et al. | |
| 6,263,331 B1 | 7/2001 | Liu et al. | |
| 6,263,410 B1 * | 7/2001 | Kao et al. | 711/156 |
| 6,265,922 B1 | 7/2001 | Kirsch | |
| 6,400,735 B1 * | 6/2002 | Percey | 370/518 |
| 6,987,775 B1 | 1/2006 | Haywood | |
| 7,106,098 B1 | 9/2006 | Zack et al. | |
| 7,283,404 B2 | 10/2007 | Khan et al. | |
| 7,333,516 B1 | 2/2008 | Sikkink et al. | |
| 7,346,861 B1 | 3/2008 | Lee | |
| 7,603,246 B2 | 10/2009 | Newcomb et al. | |
| 7,739,538 B2 | 6/2010 | Fee et al. | |
| 7,783,911 B2 | 8/2010 | Chen et al. | |
| 2003/0025217 A1 | 2/2003 | Song | |
| 2003/0120886 A1 | 6/2003 | Moller et al. | |
| 2006/0132209 A1 | 6/2006 | Meltzer et al. | |
| 2006/0136656 A1 | 6/2006 | Conley et al. | |
| 2009/0119631 A1 | 5/2009 | Cortadella et al. | |
| 2010/0174877 A1 * | 7/2010 | Yagihashi | 711/155 |
| 2010/0306426 A1 * | 12/2010 | Boonstra et al. | 710/57 |
| 2011/0040906 A1 | 2/2011 | Chung et al. | |

OTHER PUBLICATIONS

Rouse, Margaret; "Cache Memory", Sep. 2005, www.whatis.com.
Sakai et al., "Prototype Implementation of a Highly Parallel Dataflow Machine em-4", Parallel Processing Symposium, 1991 Proceedings, Fifth International IEEE, 1991.
"Electronic/Flip Flops" Nov. 29, 2011, Wikibooks, <http://en.wikibooks.org/wiki/Electronics/Flip_Flops>, retrieved on Sep. 30, 2014.
"What is the Difference Between Static RAM and Dynamic RAM?", Aug. 24, 2000, HowStuffWorks.com, <http:///computer.howstuffworks.com/question452.htm> Retrieved Sep. 29, 2014.

* cited by examiner

Primary Examiner — Anh Tran (57) ABSTRACT

A multiplexer tree operable to control an output a sequence of data stored in a plurality of storage units in accordance with a non-linear address sequence that has less bit transition counts than a linear address sequence. The non-linear address sequence is provided to the selection inputs of the multiplexer tree and causes the levels having greater numbers of multiplexers to toggle less frequently than the levels having smaller numbers of multiplexers. The non-linear address sequence may comprise a Gray code sequence where every two adjacent addresses differ by a single bit. The non-linear address sequence may be optimized to minimize transistor switching in the multiplexer tree.

20 Claims, 13 Drawing Sheets

| Address sequence | Binary Address | | | | # of toggling MUX (total=170) |
|---|---|---|---|---|---|
| | MSB (1x MUX) | (2x MUX) | (4x MUX) | LSB (8x MUX) | |
| 0 | 0 | 0 | 0 | 0 | |
| 1 | 0 | 0 | 0 | 1 | 8 |
| 2 | 0 | 0 | 1 | 0 | 12 |
| 3 | 0 | 0 | 1 | 1 | 8 |
| 4 | 0 | 1 | 0 | 0 | 14 |
| 5 | 0 | 1 | 0 | 1 | 8 |
| 6 | 0 | 1 | 1 | 0 | 12 |
| 7 | 0 | 1 | 1 | 1 | 8 |
| 8 | 1 | 0 | 0 | 0 | 12 |
| 9 | 1 | 0 | 0 | 1 | 11 |
| 10 | 1 | 0 | 1 | 0 | 12 |
| 11 | 1 | 0 | 1 | 1 | 8 |
| 12 | 1 | 1 | 0 | 0 | 14 |
| 13 | 1 | 1 | 0 | 1 | 8 |
| 14 | 1 | 1 | 1 | 0 | 12 |
| 15 | 1 | 1 | 1 | 1 | 8 |
| 0 | 0 | 0 | 0 | 0 | 15 |

Fig. 2

| Address sequence | Binary Address ||||  # of toggling MUX (total=86) |
| --- | --- | --- | --- | --- | --- |
| | MSB (1x MUX) | (2x MUX) | (4x MUX) | LSB (8x MUX) | |
| 0 | 0 | 0 | 0 | 0 | 8 |
| 1 | 0 | 0 | 0 | 1 | 4 |
| 3 | 0 | 0 | 1 | 1 | 8 |
| 2 | 0 | 0 | 1 | 0 | 2 |
| 6 | 0 | 1 | 1 | 0 | 8 |
| 7 | 0 | 1 | 1 | 1 | 4 |
| 5 | 0 | 1 | 0 | 1 | 8 |
| 4 | 0 | 1 | 0 | 0 | 1 |
| 12 | 1 | 1 | 0 | 0 | 8 |
| 13 | 1 | 1 | 0 | 1 | 4 |
| 15 | 1 | 1 | 1 | 1 | 8 |
| 14 | 1 | 1 | 1 | 0 | 2 |
| 10 | 1 | 0 | 1 | 0 | 8 |
| 11 | 1 | 0 | 1 | 1 | 4 |
| 9 | 1 | 0 | 0 | 1 | 8 |
| 8 | 1 | 0 | 0 | 0 | 1 |
| 0 | 0 | 0 | 0 | 0 | |

Fig. 4

| Address sequence | Binary Address | | | | # of toggling MUX (total=40) |
|---|---|---|---|---|---|
| | MSB (1x MUX) | (2x MUX) | (4x MUX) | LSB (8x MUX) | |
| 0 | 0 | 0 | 0 | 0 | 1 |
| 8 | 1 | 0 | 0 | 0 | 2 |
| 12 | 1 | 1 | 0 | 0 | 1 |
| 4 | 0 | 1 | 0 | 0 | 4 |
| 6 | 0 | 1 | 1 | 0 | 1 |
| 14 | 1 | 1 | 1 | 0 | 2 |
| 10 | 1 | 0 | 1 | 0 | 1 |
| 2 | 0 | 0 | 1 | 0 | 8 |
| 3 | 0 | 0 | 1 | 1 | 1 |
| 11 | 1 | 0 | 1 | 1 | 2 |
| 15 | 1 | 1 | 1 | 1 | 1 |
| 7 | 0 | 1 | 1 | 1 | 4 |
| 5 | 0 | 1 | 0 | 1 | 1 |
| 13 | 1 | 1 | 0 | 1 | 2 |
| 9 | 1 | 0 | 0 | 1 | 1 |
| 1 | 0 | 0 | 0 | 1 | 8 |
| 0 | 0 | 0 | 0 | 0 | |

POWER CONSERVATION USING GRAY-CODED ADDRESS SEQUENCING

TECHNICAL FIELD

The present disclosure relates generally to the field of integrated circuits, and, more specifically, to the field of sequential logic and addressing techniques.

BACKGROUND

A multiplexer (MUX) is a commonly used circuit element for selectively routing data or signals in integrated circuit designs. Multiplexers of different types are known in the art. In a simplest form, a 2-to-1 multiplexer has two data inputs, a select input, and an output. Based on the select input, the multiplexer operates to route one of the inputs to the output. A plurality of multiplexers can be arranged to form a multi-level multiplexer tree structure to selectively route data from a large number of inputs to, e.g. a single output.

As a typical application, a multiplexer tree structure can be used to control sequential access to a plurality of data storage units. For example, in a First-in-First-out (FIFO) memory that mainly comprises latches or flip-flops as storage units, a multiplexer tree can be a coupled between an output port and the storage units and serve to output the signals in the same sequence as the data is written into the FIFO. Conventionally, data are successively written to and read from the storage units according to the incremental linear sequence of the storage unit addresses, e.g. 0, 1, 2, 3 . . . .

Essentially a multiplexer comprises switching logic and is implemented as a combination of switches, such as CMOS transistors for instance. When a multiplexer toggles in response to a selection signal transition, the transistors in the multiplexer switch, for example, between on and off mode, and can dissipate a non-negligible amount of dynamic power due to, for instance, charging and discharging of load capacitances or short circuit power dissipation and other well-known events. In contrast, if the multiplex does not toggle, or remains in the same selection state, it consumes much less static power. Thus, the dynamic power consumed by a multiplexer tree increases accumulatively with the toggling activities and can become significant where the multiplexer tree is used to select from a large number of inputs.

Thus, the numerosity of the toggling activities in a multiplexer tree can be liable for dramatic dynamic power consumption during operation of an FIFO memory, or any other sequential logic that is coupled with such a multiplexer tree. The high power dissipation issue is particularly pronounced for low-power integrated circuit systems that have been commonly used in portable electronic devices, because the devices are often equipped with a small-size battery with limited capacity and yet often expected to operate in circumstances where wall power is unavailable.

SUMMARY OF THE INVENTION

Therefore, it would be advantageous to provide a mechanism to reduce dynamic power dissipated by a multiplexer tree structure in an integrated circuit without affecting the design of the multiplexer tree as well as related logic that uses the multiplexer tree as a selector.

Accordingly, embodiments of the present disclosure provide a multiplexer tree structure controlled by a non-linear address sequence of which bit transition counts are less than that of a linear address sequence. Thereby, the multiplexer toggling activities and consequently the associated dynamic power consumption are advantageously reduced. Embodiments of the present disclosure employ a Gray code address sequence in which every two adjacent addresses differ by a single bit. Moreover, embodiments of the present disclosure employ an optimized Gray code address sequence in which a bit that controls a level with more multiplexers switches less frequently than a bit that controls a level with less multiplexes, such that the multiplexer toggling activities are advantageously reduced during the read sequence.

In one embodiment of present disclosure, an integrated circuit comprises sequential logic operable to store and output data, a sequence generation logic operable to generate an address sequence, and a multiplexer tree operable to control the output of the data from the sequential logic in accordance with the address sequence, where the address sequence causes less transistor switching in the multiplexer tree than a linear incremental address sequence. The address sequence may comprise a Gray code sequence. The address sequence may comprise an optimized Gray code sequence which results in reduced toggling activities in the multiplexer tree and reduced dynamic power consumed by the multiplexer tree during outputting. The address sequence may cause least transistor switching in the multiplexer tree level that has a most number of multiplexers during outputting. The sequential logic may be a FIFO memory, a state machine or an ad hoc register that uses a multiplexer tree as a readout selector. The sequential logic may comprise a power of two or non-power of two number of storage units.

In another embodiment of present disclosure, a method of enabling sequential access to a plurality of data stored in a random access storage logic using a multi-level multiplexer structure comprises: (1) generating an output address sequence; (2) providing the address sequence to the multiplexer structure as selection signals; and (3) outputting the data sequentially in accordance with the address sequence. The address sequence causes less transistor switching in the multiplexer structure during outputting the data than a linear incremental address sequence. The address sequence may be further optimized and minimize transistor switching to minimize dynamic power consumed by the multiplexer structure. The address sequence may be a Gray code sequence. As different levels of the multiplexer structure may comprise different numbers of multiplexers, a selection signal that controls the level having the least number of multiplexers may change the most frequently during the outputting.

In another embodiment of present disclosure, a computer readable non-transient storage medium stores instructions for causing a processor to produce synthesizable code representing a FIFO memory by performing the operations of: (1) obtaining configuration from a user; (2) generating synthesizable code for a plurality of storage units; (3) generating synthesizable code for a read port; (4) generating synthesizable code for a multiplexer tree operable to sequentially enable access to the storage units for reading data in accordance with an predetermined address sequence; and (5) generating synthesizable code for a sequence generator. The sequence generator is operable to generate the predetermined address sequence that is designed to cause less transistor switching in the multiplexer tree than a linear address incremental sequence. The predetermined address sequence may be a Gray code sequence. The address sequence may comprise an optimized Gray code sequence in which the toggling activities in the multiplexer tree are minimized to minimized dynamic power consumed by the multiplexer tree during outputting. The address sequence may cause least transistor switching in a level that has a most number of multiplexers during outputting. The FIFO memory may comprise a nonpower-of-two number of latches or flip-flops. The multiplexer tree may comprise n levels of 2-to-1 multiplexers and each level is controlled by a common selection signal corresponding to a respective bit of a respective address in the predetermined address sequence.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying drawing figures in which like reference characters designate like elements and in which.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Power Conservation Using Gray-Coded Address Sequencing

FIG. 1a-FIG. 1d are state diagrams illustrating the multiplexer toggling activities of a multiplexer tree 120 in a FIFO memory 100 that buffers data in a linear incremental address sequence. The FIFO memory 100 comprises a latch array 110 as storage units and a multiplexer tree 120 coupled between the output of the latch array 110 and the FIFO output port (not explicitly shown). Each of the 16 latches in the latch array 110 is assigned a unique address, ranging from 0 to 15. The multiplexer tree 120 comprises four levels of 2-to-1 multiplexers arranged in a cascade pattern with 8 multiplexers in the first (bottom) level 121, 4 in the second level 122, 2 in the third level 123, and 1 in the fourth (top) level 124. The inputs of the 8 bottom level multiplexers 121 are coupled with the 16 latches 110 which are coupled with the FIFO input port (not shown) as well. The output of the top level 124 multiplexer is coupled with the FIFO output port. Through the multiplexer tree 120 that is controlled by a selection signal 130, the FIFO 100 outputs a selected data from the latch array 110.

As illustrated in FIG. 1a-1d, all the multiplexers in an individual level are commonly controlled by a respective bit in a selection signal which is the 4-bit address associated with the latch to be read from in a reading operation. The address is typically provided by an address sequence counter (not shown). The least significant bit (LSB) of the address 130 is coupled with bottom level 121, and the most significant bit (MSB) is coupled with the top level 124.

Figure 1A:
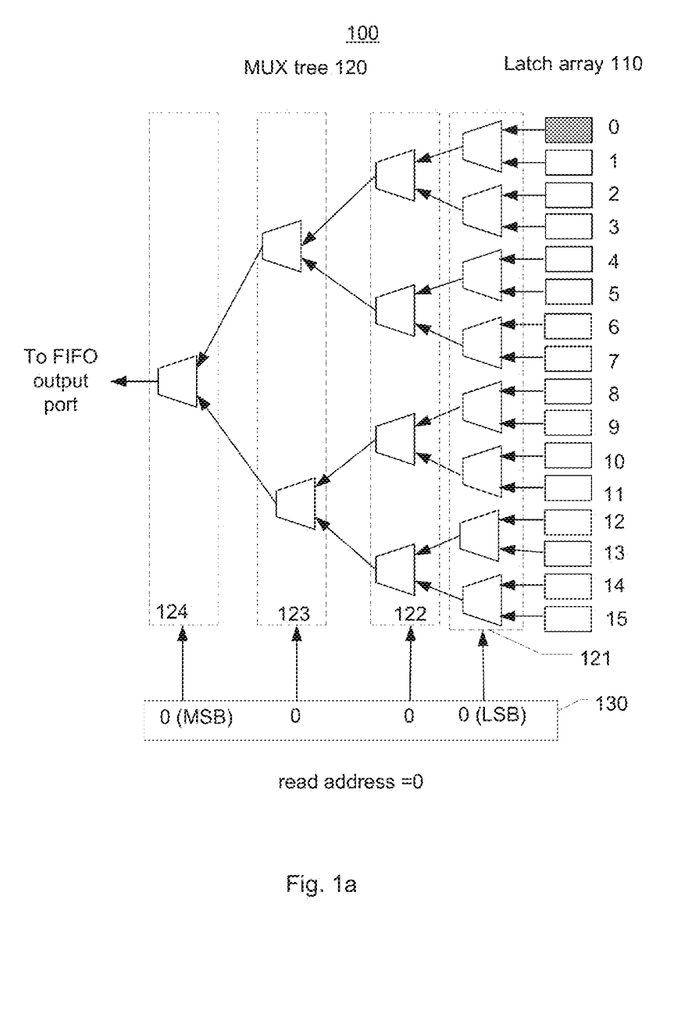
FIG. 1a-FIG. 1d are state diagrams illustrating the multiplexer toggling activities of a multiplexer tree in a FIFO memory that buffers data in a linear incremental address sequence.
Figure 1B:
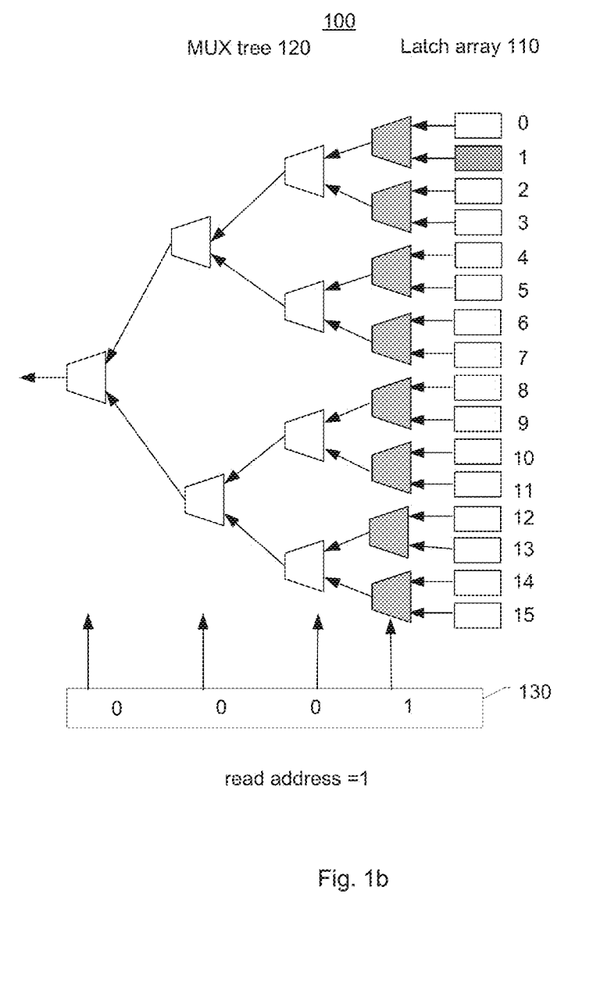
Figure 1C:
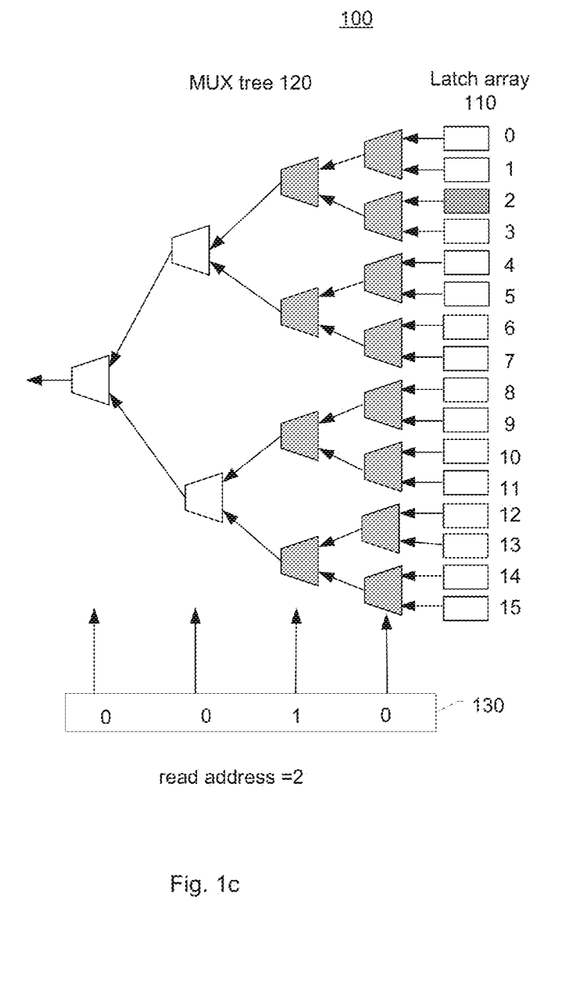
Figure 1D:
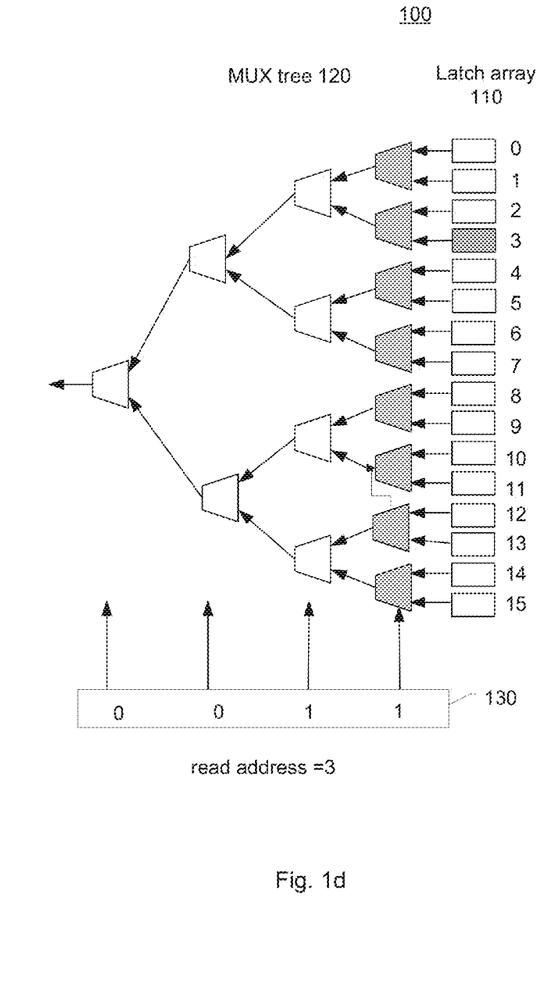

FIG. 1a shows an initial read operation to read from the latch (shaded in the FIG. 1a) with address 0, or (0000). All levels of the multiplexer tree receive "0" at the selection input to enable access to latch 0. Subsequently, as shown in FIG. 1b, as the read address becomes 0001 to read from latch 1 (shaded in FIG. 1b), all the 8 multiplexers in the bottom level 121 toggle (shaded in FIG. 1b) in response to the selection input transition from "0" to "1" while levels 122, 123, 124 remain static. As the read address becomes 0010 to read from latch 2 (FIG. 1c), both the first level 121 and the second level 122 are subject to selection signal switch, from "1" to "0" and from "0" to "1", respectively. As a result, the 12 multiplexers in levels 121 and 122 toggle in response. In the next read operation, the read address becomes 0011 (FIG. 1d), the bottom 8 multiplexers 121 toggle again in response to the transition of the LSB of the address 130.

Figure 2:
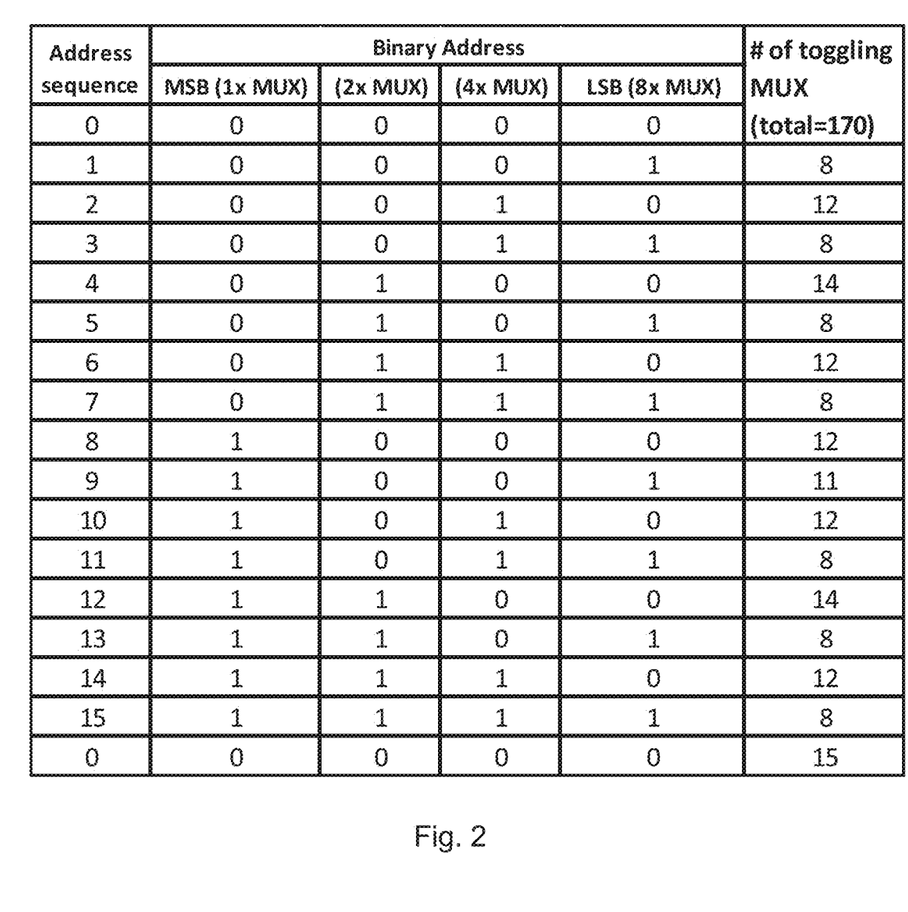
FIG. 2 is a chart listing the read addresses and corresponding toggling activities of the multiplexer tree as in FIG. 1a-1d in a linear incremental address sequence.

FIG. 2 is a chart listing the read addresses and corresponding toggling activities of the multiplexer tree 120 in FIG. 1a-FIG. 1d according in a linear address sequence. As can be seen, the LSB controls the bottom level which has the greatest number of multiplexers and yet changes most frequently in the linear address sequence, causing the 8 multiplexers to toggle in each successive address transition. In contrast, the single multiplexer controlled by the MSB only changes once during reading from address 0 to address 15. The accumulative toggling activities amount to 170 occurrences at the end of this address sequence.

Because the physical address sequence used for writing to and reading from the storages units in sequential logic is usually transparent to the logic that provide or receive the data, an address sequence that is different from a linear address sequence can be utilized to control access sequence to the storage units through a multiplexer tree without requiring substantial amendments in the designs for the multiplexer tree or the sequential logic. Embodiments of this disclosure advantageously employ address sequences that cause less bit transition counts than a linear address sequence. Thereby, less transistor toggling activities and less dynamic power dissipation in the multiplexer tree result. Such address sequence may comprise a Gray code sequence where two successive numbers in the sequence differ in only one bit and thus has less bit transition counts than a linear sequence in a reading cycle. Moreover, multiplexer toggling activities in a reading cycle may be further reduced by using an optimized address sequence where the different numbers of multiplexers controlled by different bits in an address selection signal are taken into account.

FIG. 3a-FIG. 3d are state diagrams illustrating the multiplexer toggling activities of a multiplexer tree 320 in a FIFO memory that buffers data in an exemplary optimized Gray code address sequence in accordance with an embodiment of the present disclosure. The latch array 310 and the multiplexer tree 320 have the similar configurations as their counterparts in FIG. 1a-FIG. 1d, where the multiplexer tree comprises four levels of 2-to-1 multiplexers coupled with 16 latches with addresses ranging from 0 to 15. Each bit of the address signal 330 is coupled with the selection input of a respective level (321, 322, 323, or 324) of the multiplexer tree 320. According this embodiment, data is read from addresses 0 (0000), 8 (1000), 12 (1100) and 4 (0100) in sequence. For purposes of illustration, it is assumed that data have been pushed to the latch array 310 through the FIFO input port (not shown) in the same order.

Figure 3A:
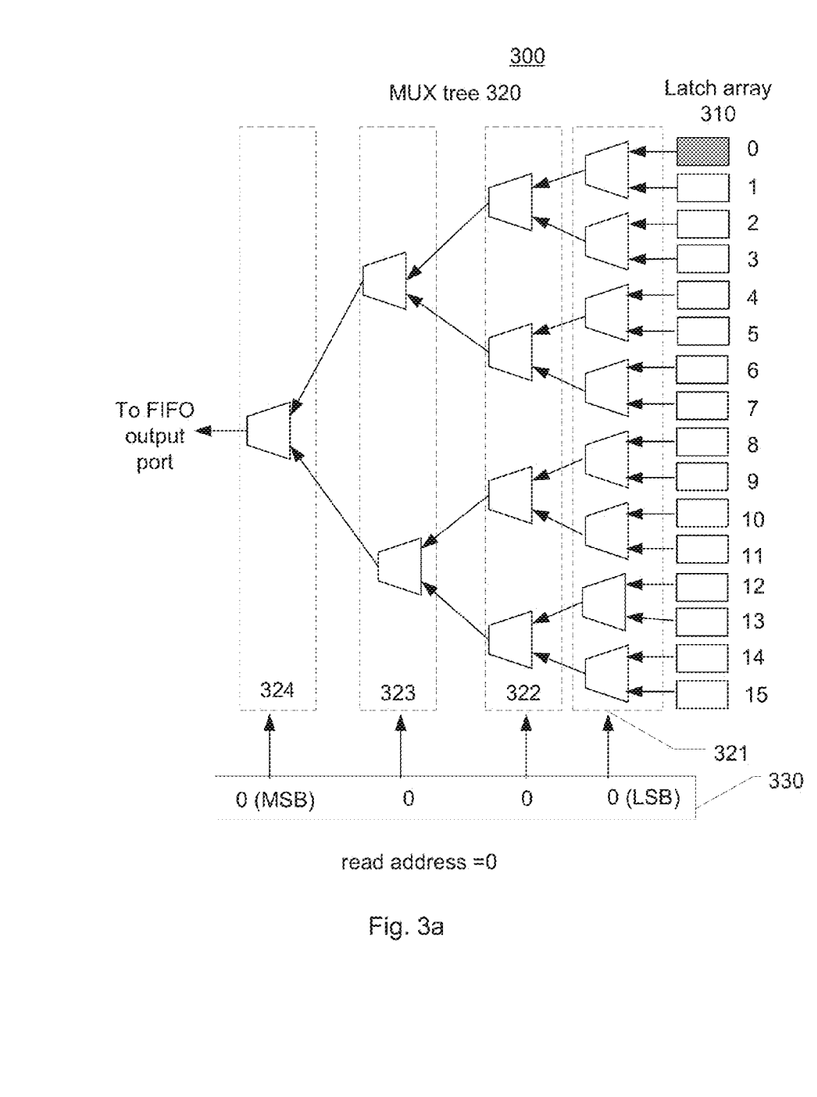
FIG. 3a-FIG. 3d are state diagrams illustrating the multiplexer toggling activities of a multiplexer tree in a FIFO memory that buffers data in an exemplary optimized Gray code address sequence in accordance with an embodiment of the present disclosure.
Figure 3B:
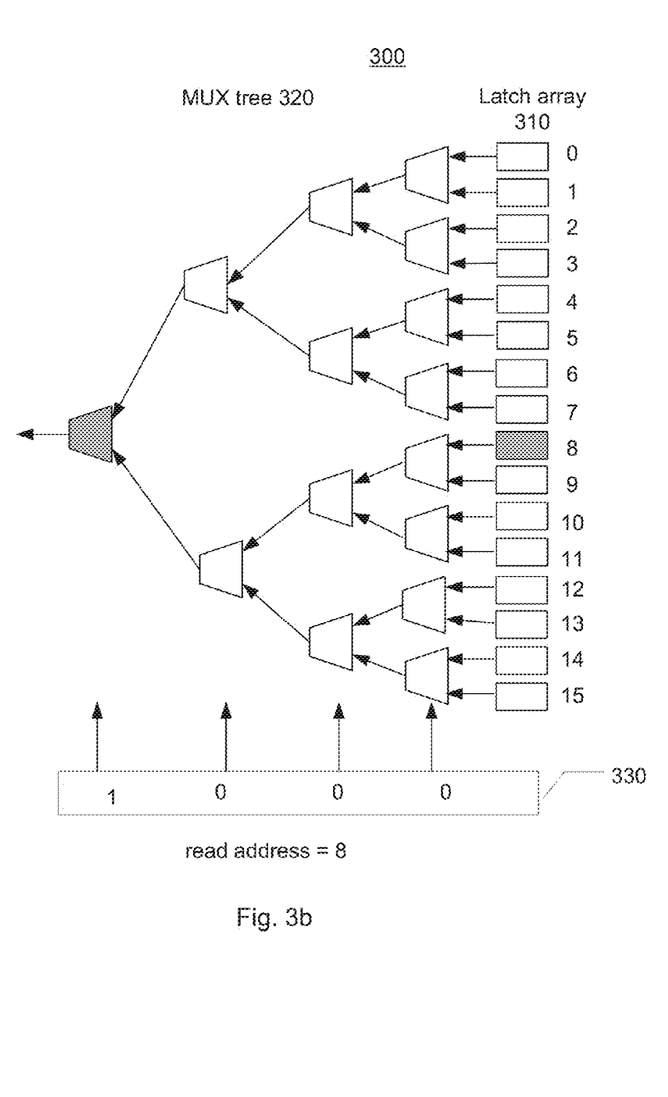
Figure 3C:
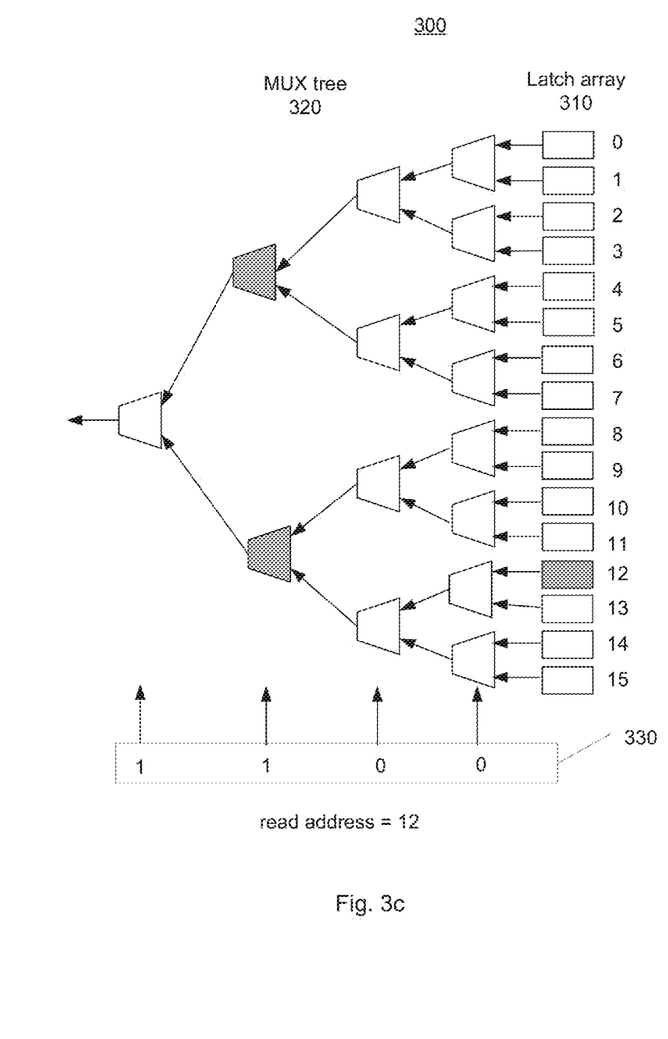
Figure 3D:
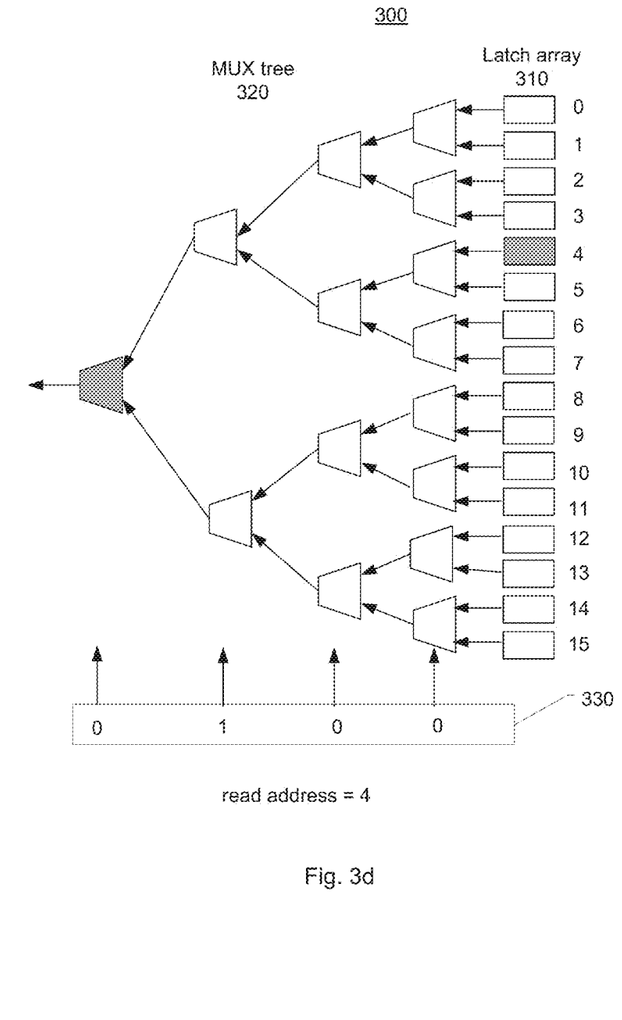

FIG. 3a illustrates the first read operation from address 0 (0000), where all levels of the multiplexer tree receive "0" as selection signals. Subsequently, as shown in FIG. 3b, instead of reading from address 1 (0001) which requires all 8 multiplexers to toggle as in the prior art, the multiplexer tree selects and routes data from address 8 (1000) in the second read operation which advantageously requires only the single multiplexer in the top level 324 to toggle from "0" to "1". In the next read operation (FIG. 3c), data stored in address 12 (1100) is output through the multiplexer tree 320, which advantageously requires only a single level, namely the third level 323, that comprises only 2 multiplexers to toggle from "0" to "1". Similarly in the fourth reading operation (FIG. 3d), data from address 4 (0100) is selected and routed to the FIFO output port, which requires the single top level 324 multiplexer to toggle from "1" to "0".

Thus, comparing with FIG. 1a-1d which employs a linear address sequence for outputting data, as well as inputting the data, the embodiment in FIG. 3a-3d significantly reduces the toggling activities by employing a Gray code address sequence which requires only one level of multiplexer to toggle in each successive read operation. Furthermore, this specific Gray code address sequence renders the top levels with less numbers of multiplexers toggle more frequently than the bottom levels.

Figure 4:
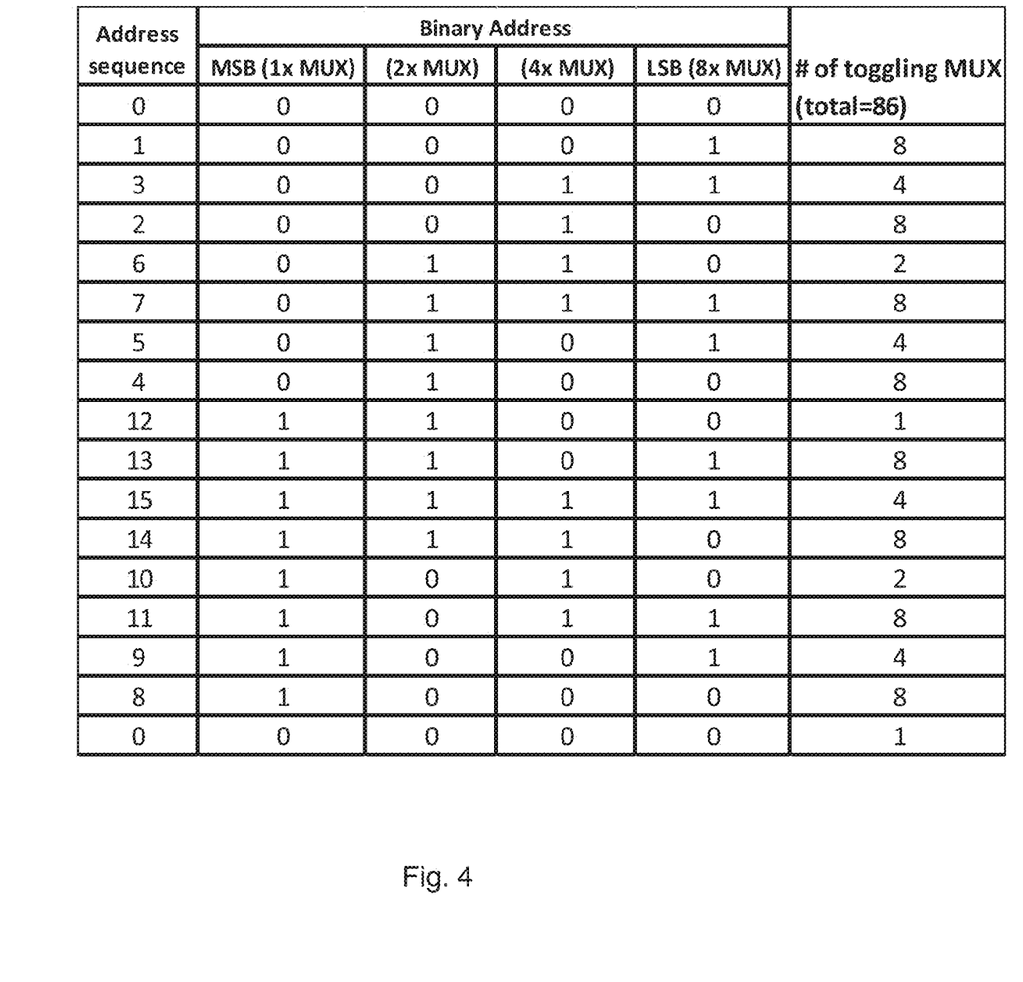
FIG. 4 is a chart listing the read addresses and corresponding toggling activities of a multiplexer tree in an exemplary Gray code address sequence in accordance with an embodiment of the present disclosure.

FIG. 4 is a chart listing the read addresses and corresponding toggling activities of a multiplexer tree in an exemplary Gray code address sequence in accordance with an embodiment of the present disclosure. The multiplexer tree has the similar configuration as those illustrated in FIG. 1a-FIG. 1d and FIGS. 3a-3d. In this particular embodiment, the Gray code sequence is 0, 1, 3, 2, 6, 7, 5, 4, 12, 13, 15, 14, 10, 11, 9, and 8. As shown by the binary address sequence, each transition of the address causes only one bit to change and hence only one level of multiplexers to toggle. The rightmost column lists the toggling activities in each transition and summarizes the total to be 86 counts for all 16 addresses.

Figure 5:
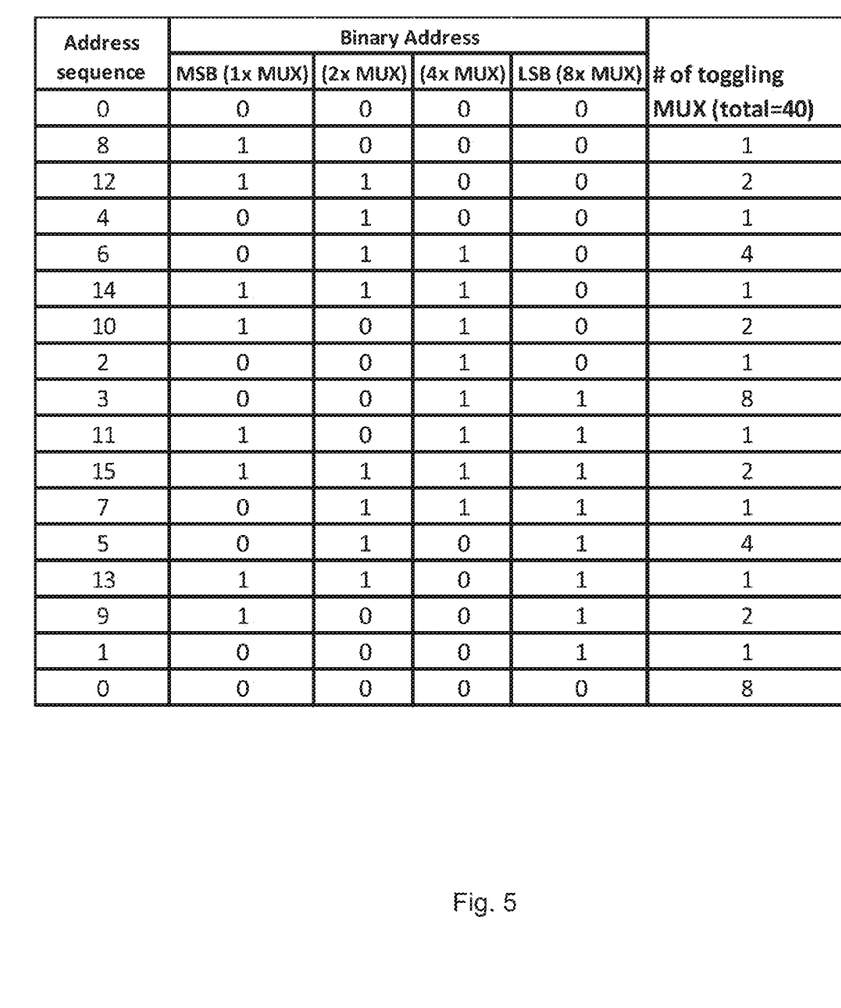
FIG. 5 is a chart listing the read addresses and corresponding toggling activities of a multiplexer tree in an exemplary optimized Gray code address sequence in accordance with an embodiment of the present disclosure.

Alternate Gray code sequences that can be used to control access sequence of data or signals from sequential logic through a multiplexer structure also fall within the purview of the present disclosure. FIG. 5 is a chart listing the read addresses and corresponding toggling activities of a multiplexer tree in another exemplary Gray code address sequence in accordance with an embodiment of the present disclosure. In this embodiment, the multiplexer tree also has the similar configuration as those illustrated in FIG. 1a-FIG. 1d and FIG. 3a-FIG. 3d. In this particular embodiment, the Gray code sequence is 0, 8, 12, 4, 6, 14, 10, 2, 3, 11, 15, 7, 5, 13, and 9.

According to this sequence, not only every two adjacent addresses differ only by one bit and so only one level toggles in each transition, but also the levels having greater numbers of multiplexers are advantageously caused to toggle infrequently. As such, the power efficiency of the multiplexer tree is further improved. More explicitly, during the 16-address read operations as listed in FIG. 5, the bottom level 8 multiplexers toggle only twice along with the LSB, and the second level 4 multiplexers toggle only twice as well. In contrast, the higher two levels having only one and two multiplexers respectively toggle much more frequently. The total number of toggling counts is merely 40 in this sequence, which is remarkably lower than both sequences shown in FIG. 2 and FIG. 3a-FIG. 3d.

In some embodiments, a non-linear address sequence that is not a Gray code sequence may still be able to reduce the toggling activities of a multiplex structure to a large degree. For instances, the reduced toggling activity may be attributed at least in part to higher toggling frequency assigned to the levels with smaller numbers of multiplexers and the correspondingly lower toggling frequency assigned to the levels with greater numbers of multiplexers.

Although only 2-to-1 multiplexers are used in the illustrated examples, any other type of multiplexers in conjunction with correspondingly suitable selection signal format can be used to implement this disclosure. For example, the constituent multiplexers can be 4-to-1, 8-to-1, or 16-to-1 MUX, or a combination thereof.

In some embodiments, the Grade code address sequencing scheme can be similarly used to control selection sequence of a demultiplexer tree structure, e.g., as a decoder.

Figure 6A:
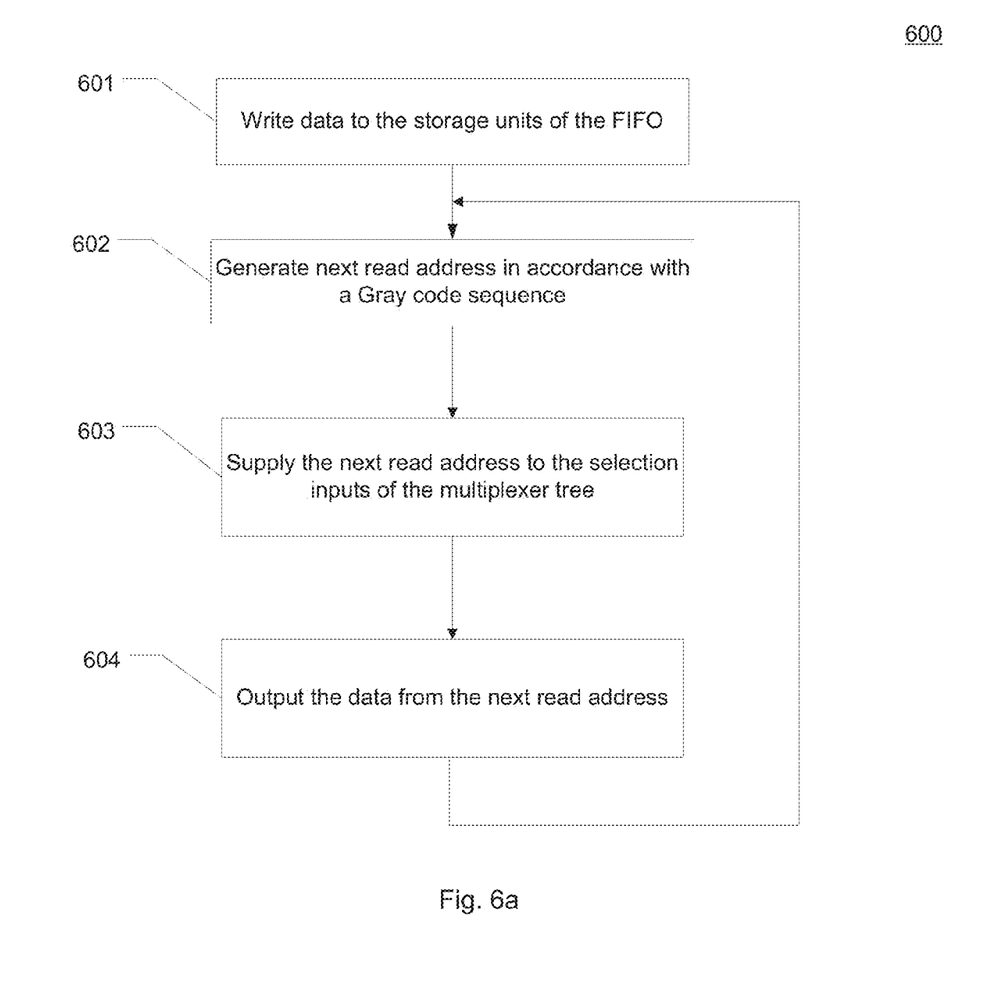
FIG. 6a is a flow diagram depicting an exemplary method of buffering data in a FIFO memory in a predetermined Gray code address sequence in accordance with an embodiment of the present disclosure.

FIG. 6a is a flow diagram depicting an exemplary method 600 of buffering data in a FIFO memory in a predetermined Gray code address sequence in accordance with an embodiment of the present disclosure. At 601, a plurality of data can be pushed into a FIFO memory in a Gray code address sequence. In some embodiments, the input address sequencing of the FIFO memory can be provided to a decoder, e.g. a one-hot or a demultiplexer structure as stated above. At 602, the next read address can be generated by a Gray code sequence counter in accordance with the same Gray code address sequence. At 603, the next read address can be supplied to the multiplexer tree that is coupled with the output port of the FIFO memory. At 604, the data stored in the selected read address of the FIFO can be routed to the output port of the FIFO through the multiplexer tree. Operations from 602 to 604 are repeated and thereby the plurality of data are output in the same Gray code address sequence as they are written in the FIFO.

In some embodiments, the address sequencing method 600 can be applied in readout sequencing for either synchronous or asynchronous FIFO memories. In some other embodiments, the method can also be applied in other sequential control logic contexts where sequential access to a plurality of addresses is enabled through a multiplexer structure in a known order. For example, in some of such embodiments, a Gray code sequence can be used to control state sequencing of a state machine in a predetermined order through a multiplexer structure. In some other embodiments, such a non-linear sequence can be used to control a multiplexer tree coupled to an ad hoc register.

Figure 6B:
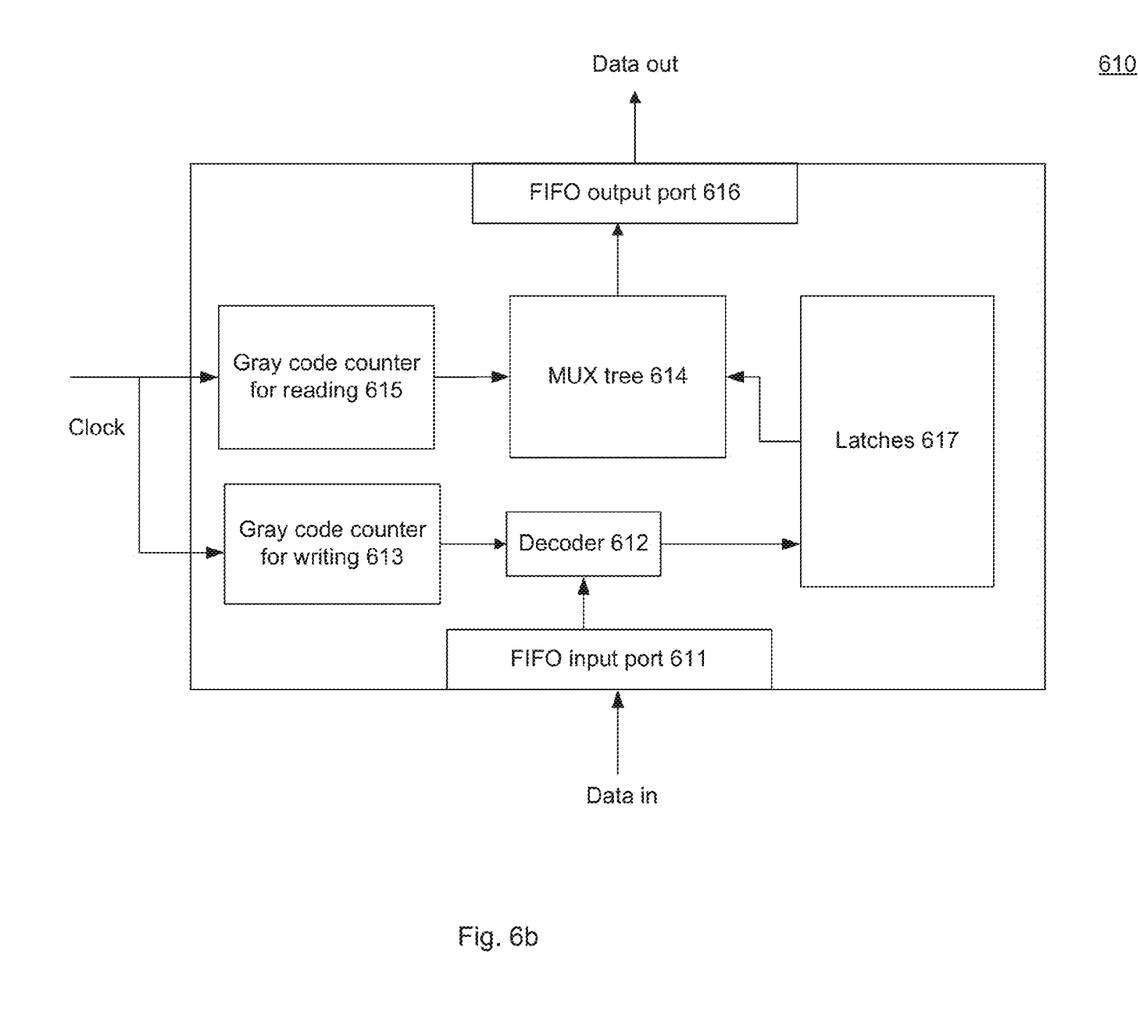
FIG. 6b is a functional block diagram illustrating an exemplary FIFO memory system that comprises a multiplexer tree using a Gray code address sequence in accordance with an embodiment of the present disclosure.

FIG. 6b is a functional block diagram illustrating an exemplary FIFO memory system 610 that comprises a multiplexer tree and can use method 600 in accordance with an embodiment of the present disclosure. The FIFO memory comprises an input port 610 for data input, a plurality of latches 617 as storage units, a multiplexer tree 614 coupled with a Gray code counter for reading 615, a decoder 612 coupled with a Gray code for writing 613, and an output port 616 for data output.

A series data can be received at the input port 611 and assigned to the latches 617 through the decoder according to a Gray code address sequence generated by the Gray code counter for writing 613. The multiplexer tree 614 selects and routes data sequentially from the latches 617 and provide to the output port 616 according to another Gray code address sequence generated by the Gray code counter for reading 615. Typically in a FIFO, the Gray code address sequences for reading and writing are identical. In some embodiments, the two Gray code counters 613 and 615 share the same clock signal, as illustrated.

Figure 7:
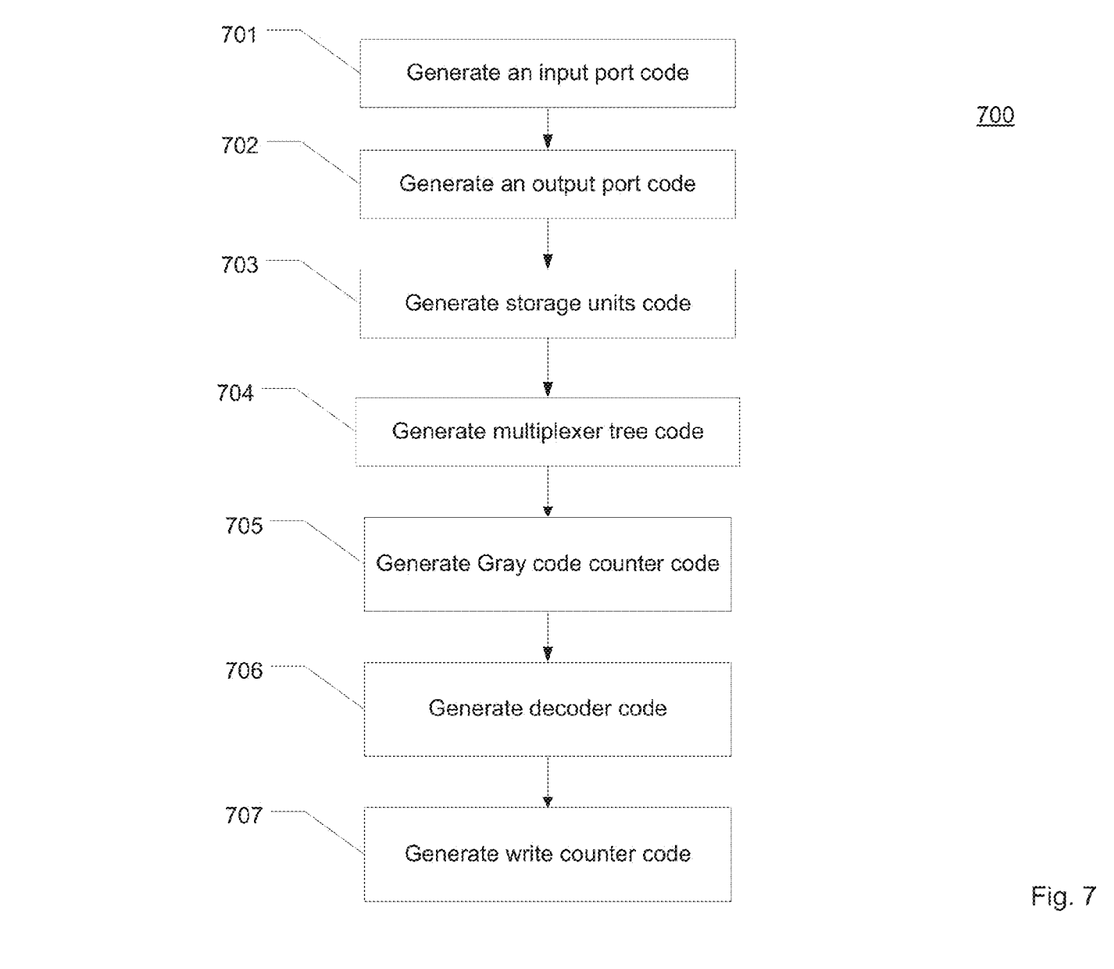
FIG. 7 is a flow diagram depicting an exemplary method of generating synthesized code for a FIFO memory that comprises a multiplexer tree structure and a Gray code counter in accordance with an embodiment of the present disclosure.

The components of sequential logic that comprises a plurality of storage units and a multiplexer tree structure in accordance with the present disclosure as well as associated circuitry disclosed herein can be produced automatically in, such as, VHDL, Verilog, or other hardware description languages known to those skilled in the art. FIG. 7 is a flow diagram depicting an exemplary method 700 of generating synthesized codes for a FIFO memory that comprises a multiplexer tree structure and employs a Gray code for address sequencing in accordance with an embodiment of the present disclosure. At 701, an input port code generator can be executed to generate an input port code. At 702, an output port code generator can be executed to generate an output port code. At 703, a storage unit code generator can be executed to generate a plurality of storage units of known depth and width. At 704, a multiplexer tree code generator can be executed to generate the multiplexer tree structure that comprises a plurality of multiplexers arranged in a known pattern. At 705, a Gray code counter code can be executed to generate a Gray code counter programmed with a particular Gray code sequence. The particular Gray code sequence can be generated automatically as described in details in the following. The Gray code counter may be coupled to the selection inputs of the multiplexer tree structure and operable to provide a Gray code sequence as the read address sequence.

At 706, a decoder code generator can be executed to generate a decoder that is capable of control allocation of the data to the storage units in accordance with a writing sequence. At 707, a write counter generator can be executed to generate a write counter that is capable of generating a sequence of write addresses to control the decoder. In some embodiments, the write sequence can be an instantiation of the same Gray code counter design as the one used for the read address generation. However, in some other embodiments, the write and read address sequences are not required to be identical as in a FIFO memory, such as the sequences used to control a state machine.

For purposes of implementing this disclosure, the sequential logic may comprise any known number of storage units. In some embodiments, a multiplexer tree can be coupled with a power-of-two number of storage units, or $2^n$ where n is a positive integer. In some other embodiments, a multiplexer tree can be coupled with a non-power-of-two number of storage units, i.e. a number between $2^{1-1}$ and $2^n$.

Figure 8:
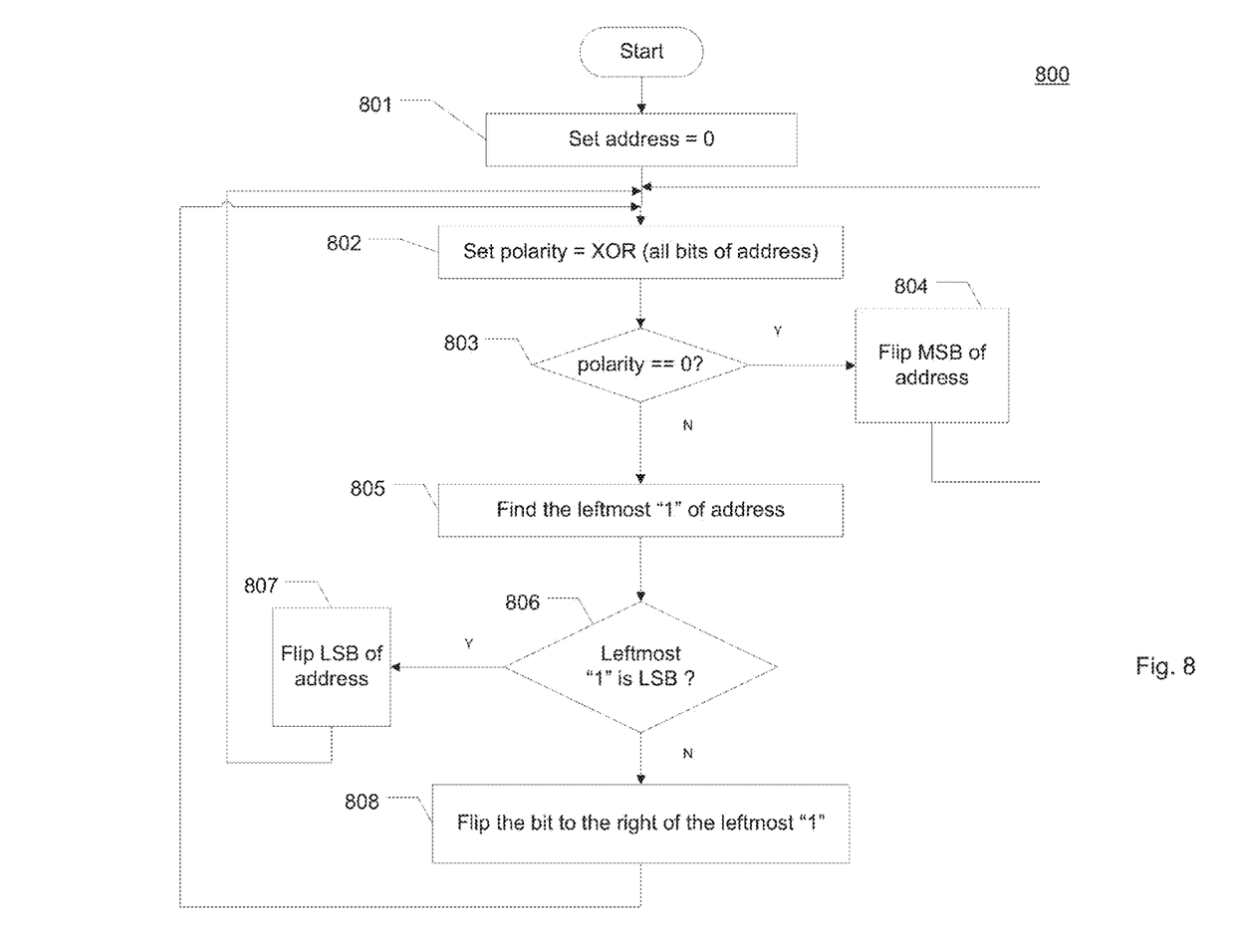
FIG. 8 is a flow diagram depicting an exemplary method of generating an optimized Gray code sequence for a $2^n$ number of addresses in accordance with an embodiment of the present disclosure.

The present disclosure is not limited by any particular method that can be used to generate a non-linear address sequence, or more particularly, to generate a Gray code address sequence. FIG. 8 is a flow diagram depicting an exemplary method 800 of generating an optimized Gray code sequence for a $2^n$ number of addresses in accordance with an embodiment of the present disclosure. Thus the address width can be equal to n. In this embodiment, it is assumed that the resultant Gray code sequence is used to control a multiplexer tree structure with a cascade arrangement and similar with 220 in FIG. 2. In this arrangement, the MSB of an address controls a level with the least number of multiplexers, while the LSB controls a level with the most number of multiplexers.

At 801, the address is initialized to n bits of 0. At 802, a bitwise XOR is performed on all n bits of address and assigned to a variable "Polarity." If it is determined that "polarity" is equal to 0 at 803, flip the MSB of address at 804. Otherwise, find the leftmost "1" at 805. If it is determined that the leftmost "1" is the LSB at 806, flip the LSB at 807; otherwise, flip the bit to the right of the leftmost "1" at 808. The foregoing steps 802-808 are repeated to generate all the addresses in the address sequence. For example, if the depth of a FIFO memory is 16 with addresses from 0 to 15, a Gray code sequence as illustrated in FIG. 4 can be generated using method 800.

Table 1 is an exemplary synthesizable code of a 16-address Gray code sequence instance generated using method 800 in accordance with an embodiment of the present disclosure.

Figure 9:
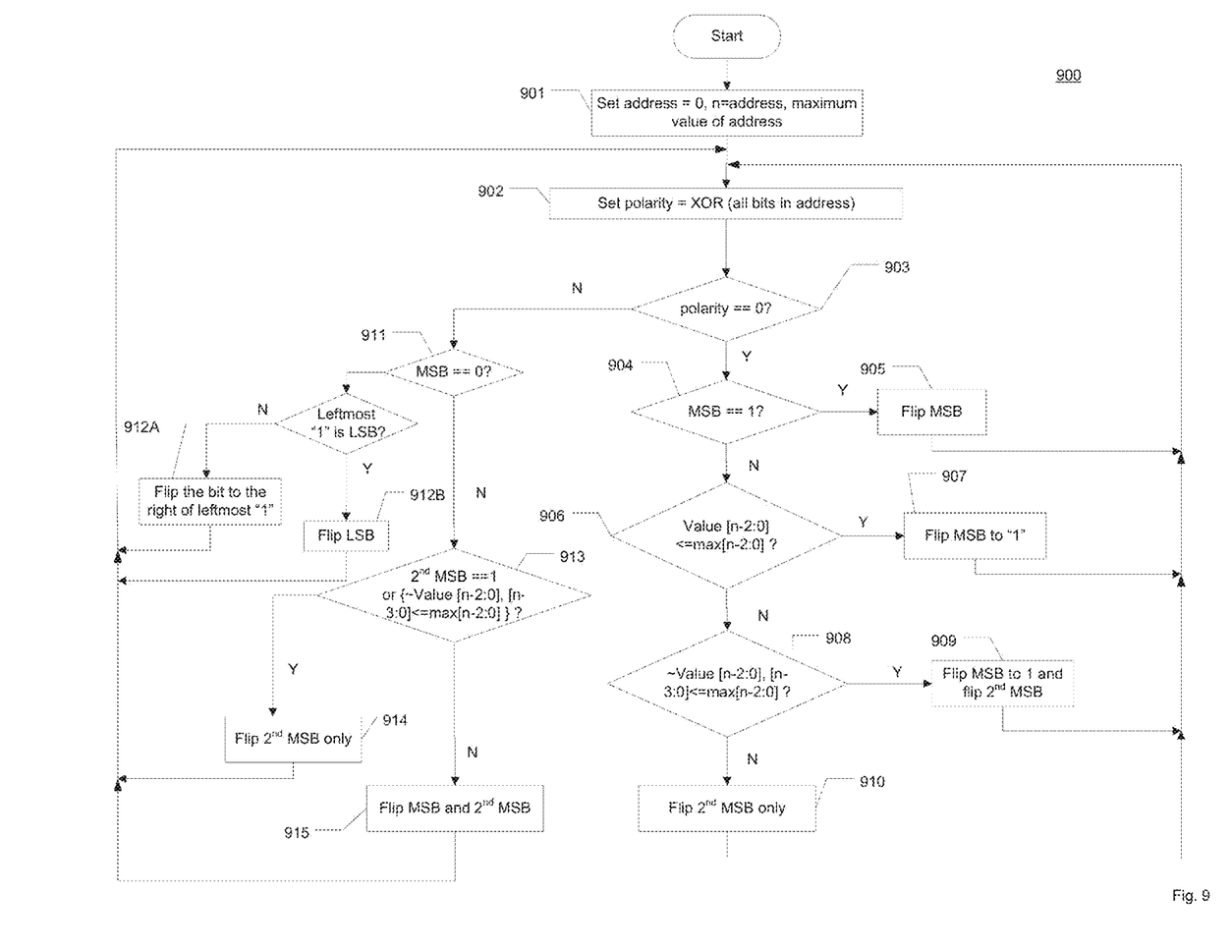
FIG. 9 is a flow diagram depicting an exemplary method of generating an optimized address sequence for a non-power-of-two number (between $2^{n-1}$ and $2^n$) of addresses in accordance with an embodiment of the present disclosure.

FIG. 9 is a flow diagram depicting an exemplary method 900 of generating an optimized address sequence for a non-power-of-two number ($2^{n-1}<N<2^n$) of addresses in accordance with an embodiment of the present disclosure. For instance, the depth of address N is equal to 17, the address width is equal to 5 bits, and the address ranges from 0 to 16. At 901, the address width is initialized to n and the address is initialized to n bits of 0 (from bit 0 to bit n-1). The maximum address value is also initialized to N-1. At 902, a bitwise XOR is performed on all n bits of the address and assigned to a variable "polarity."

If it is determined that "polarity" is equal to "0" at 903, it is then determined whether the MSB of address (bit n-1) is equal to "1" at 904. If the MSB is equal to "1", flip the MSB at 905; otherwise, it is further determined whether the value of the rightmost n-1 bits (Value[n-2:0]) bits of address is less than or equal to the maximum value of the rightmost n-1 bits (max [n-2:0]) of address at 906. If Value [n-2:0] is less than or equal to the max[n-2:0], flip the MSB to "1" at 907. However, if Value [n-2:0] is greater than max[n-2:0], as determined at 906, flip bit n-2 (~Value[n-2]) and combine it with the rightmost n-2 bits to form {~Value[n-2], [n-3:0]} at 908. If it is determined at 908 that {~Value[n-2], [n-3:0]} is less than or equal to the maximum value of the rightmost n-1 bits ({~Value[n-2], [n-3:0]}≤max[n-2:0]), flip MSB to 1 and flip the second MSB at 909. However, if {~Value[n-2], [n-3:0] }>max[n-2:0], flip the second MSB only at 910.

On the other hand, if the "polarity" is equal to "1" at 903, and it is further determined that the MSB is equal to "0" at 911, flip the bit to the right of the leftmost "1" at 912A if the leftmost "1" is not the LSB. Otherwise flip the LSB at 912B. However, if the MSB is equal to "1" at 911, it is further determined at 913 whether the second MSB is "1" or the {~Value[n-2], [n-3:0]} is less or equal to the maximum value of the rightmost n-1 bits at 913. If "yes" at 913, flip the second MSB only; otherwise, flip both the MSB and the second MSB at 915. The foregoing steps from 902 to 915 are repeated to generate all the addresses in the address sequence.

Table 2 is an exemplary synthesizable code of a 17-address Gray code sequence instance generated using method 900 in accordance with an embodiment of the present disclosure.

Figure 10:
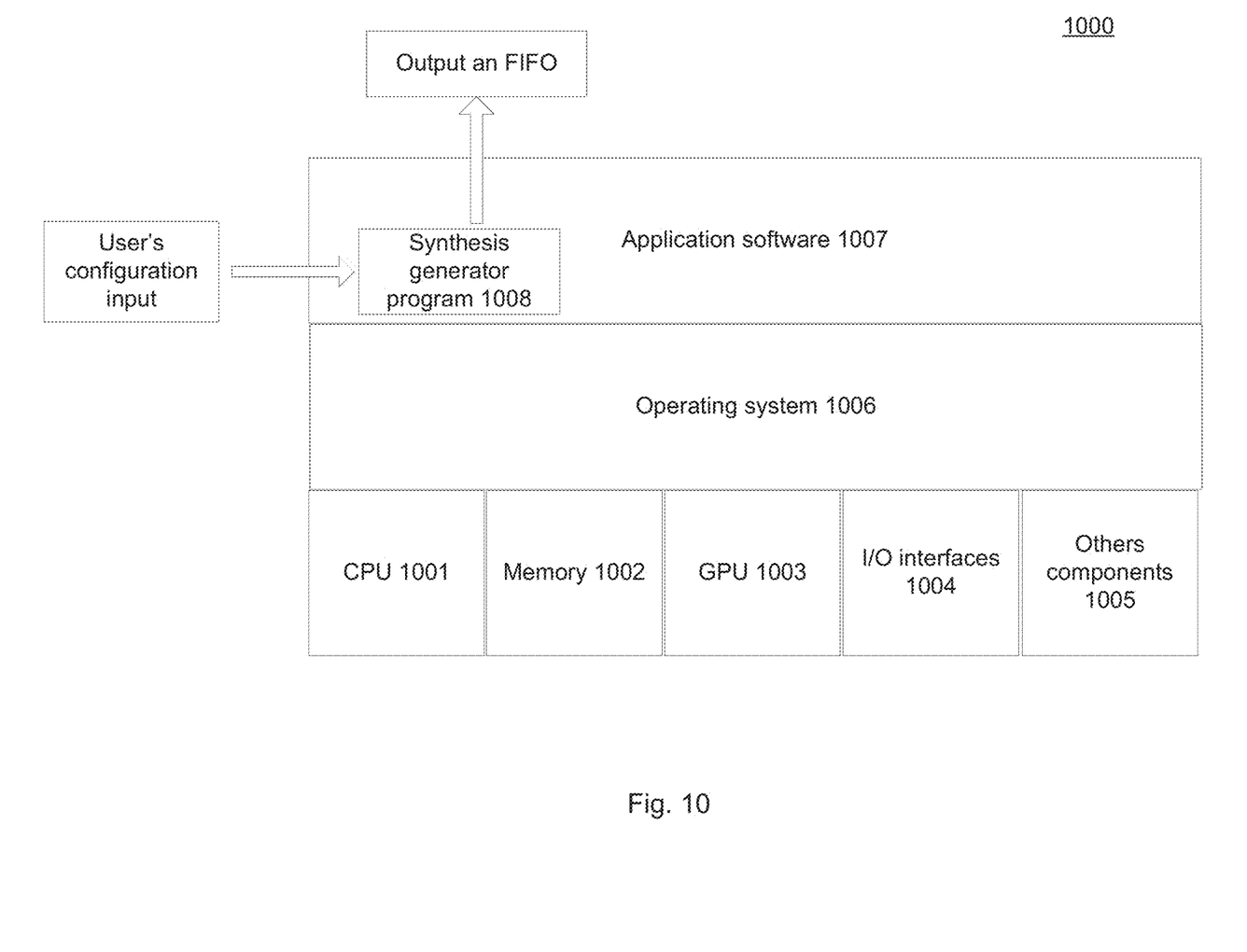
FIG. 10 is a block diagram illustrating a computing system including a synthesized code generator in accordance with an embodiment of the present disclosure.

FIG. 10 is a block diagram illustrating a computing system 1000 including a synthesized code generator 1008 in accordance with an embodiment of the present disclosure. The computing system comprises a processor 1001, a system memory 1002, a GPU 1003, 110 interfaces 1004 and other components 1005, an operating system 1006 and application software 1007 including a synthesis generator program 1008 stored in the memory 1002. When incorporating the user's configuration input and executed by the processor 1001, the generator program 1008 produces a synthesizable code representing a respective component of a FIFO memory that comprises a multiplexer tree and a Gray code sequence counter, as discussed with reference to FIG. 7. The synthesizable code may be combined with other code, either produced by a generator program or authored by a programmer, to produce synthesizable code for an integrated circuit. Synthesizable code may be written in Verilog, VHDL, or other hardware description languages known to those skilled in the art.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. An integrated circuit comprising:
   sequential logic operable to store and output a plurality of data, wherein a respective location of each of said plurality of data in said sequential logic is assigned a respective address represented by a plurality of digits;
   sequence generation logic operable to generate an address sequence that comprises a sequence of addresses of said plurality of data in said sequential logic; and
   a multiplexer structure comprising a plurality of levels of multiplexers arranged in a hierarchical order, each level comprising one or more multiplexers, wherein said multiplexer structure is coupled with an output of said sequential logic and is further operable to control an output sequence of said plurality of data from said sequential logic in accordance with said address sequence,
   wherein said address sequence is generated based on reducing an aggregate number of transistor switching activities across said multiplexer structure during outputting said plurality of data from said sequential logic.

2. The integrated circuit as described in claim 1, wherein said sequential logic comprises one of: a state machine; an ad hoc register; and a First-in First-out (FIFO) memory.

3. The integrated circuit as described in claim 1, wherein said address sequence comprises a Gray code sequence in which each two adjacent addresses differ by a single digit.

4. The integrated circuit as described in claim 1, wherein said Gray code sequence comprises an optimized Gray code sequence, and wherein transistor switching activities in said multiplexer structure are reduced to reduce dynamic power consumed by said multiplexer structure during outputting said plurality of data from said sequential logic.

5. The integrated circuit as described in claim 1, wherein said sequential logic comprises a FIFO memory comprising a plurality of latches or flip-flops, or a combination thereof, and wherein said multiplexer structure is used as a readout selector.

6. The integrated circuit as described in claim 5, wherein said sequential logic is an asynchronous FIFO.

7. The integrated circuit as described in claim 3, wherein said FIFO memory comprises a non-power-of-two number of storage locations.

8. The integrated circuit as described in claim 3, wherein said multiplexer structure comprises a plurality of levels of 2-to-1 multiplexers, and wherein further said multiplexers in each level of said multiplexer structure are controlled by a selection signal corresponding to a respective digit of a respective address in said address sequence.

9. The integrated circuit as described in claim 1, wherein all levels of said multiplexer structure have different numbers of multiplexers, and wherein said address sequence causes least transistor switching in a level that has a most number of multiplexers during outputting said plurality of data from said sequential logic.

10. A method of enabling sequential access to a plurality of data stored in random access storage logic using a multi-level multiplexer structure, said method comprising:
    generating an address sequence that comprises a sequence of addresses, each address representing a respective location of each of said plurality of data stored in said random access storage logic;
    providing said address sequence to said multi-level multiplexer structure as selection signals;

outputting said plurality of data sequentially in accordance with said address sequence; and optimizing said address sequence based on reducing an aggregate number of transistor switching activities across said multi-level multiplexer structure during said outputting said plurality of data.

11. The method as described in claim 10, wherein said random access storage logic comprises a non-power-of-two number of storage locations, and wherein said optimizing comprises optimizing said address sequence such that transistor switching in said multi-level multiplexer structure is minimized to minimize dynamic power consumed by said multi-level multiplexer structure.

12. The method as described in claim 10, wherein said generating an address sequence comprises generating a Gray code sequence where each two adjacent addresses have a single digit differing.

13. The method as described in claim 12, wherein multiplexers in each level of said multiplexer structure are controlled by a selection signal corresponding to a respective bit of a respective address in said Gray code sequence.

14. The method as described in claim 13, wherein different levels of said multi-level multiplexer structure comprise different number of multiplexers, and wherein further a selection signal that controls a level that has a least number of multiplexers changes the most frequently during the outputting.

15. The method as described in claim 10 further comprising writing said plurality of data to said random access logic sequentially in accordance with said address sequence.

16. A computer readable non-transient storage medium storing instructions for causing a processor to produce synthesizable code representing a FIFO memory by performing operations of:

obtaining configuration input from a user, wherein said configuration input includes a depth and a width of said FIFO memory;

generating a first portion of the synthesizable code representing a plurality of storage units;

generating a second portion of the synthesizable code representing a read port operable to sequentially output data stored in said FIFO memory;

generating a third portion of the synthesizable code representing a multiplexer tree structure that comprises a plurality of levels of multiplexers, said multiplexer tree structure operable to sequentially enable access to said plurality of storage units for reading data to in accordance with an predetermined address sequence; and generating a fourth portion of the synthesizable code representing a sequence generator that is configured to generate said predetermined address sequence of said plurality of storage units, wherein said predetermined address sequence is generated based on reducing an aggregate number of transistor switching activities across said multiplexer tree structure during outputting data from said FIFO memory.

17. A computer readable non-transient storage medium as described in claim 16, wherein said predetermined address sequence comprises a Gray code sequence in which each two adjacent addresses in said Gray code sequence have a single bit differing.

18. A computer readable non-transient storage medium as described in claim 16, wherein said predetermined sequence is an optimized Gray code address sequence wherein transistor switching in said multiplexer tree structure is reduced to reduce dynamic power consumed by said multiplexer tree structure, during outputting said plurality of data from said FIFO memory.

19. A computer readable non-transient storage medium as described in claim 16, wherein the operations further comprise performing the operation of generating a fifth portion of the synthesizable code representing a write port coupled with a decoder, said decoder operable to enable sequential access to said plurality of storage units for writing data in accordance with said predetermined addresses sequence.

20. A computer readable non-transient storage medium as described in claim 16, wherein said plurality of storage units comprises a number of latches that is greater than $2^{n-1}$ and less than $2^n$, where n is a positive integer, and wherein said multiplexer tree structure comprises n levels of 2-to-1 multiplexers, and wherein further each level of multiplexers are controlled by a common selection signal corresponding to a respective bit of a respective address in said predetermined address sequence.

* * * * *